(12) United States Patent
Zhang et al.

(10) Patent No.: US 11,757,417 B2
(45) Date of Patent: Sep. 12, 2023

(54) DIFFERENTIAL AMPLIFIER COMMON-MODE REJECTION RATIO AND GAIN TRIMMING CIRCUIT

(71) Applicant: SHANGHAI ANALOGY SEMICONDUCTOR TECHNOLOGY LTD., Shanghai (CN)

(72) Inventors: Jun Zhang, Shanghai (CN); Yi Du, Shanghai (CN); Zhihao Yan, Shanghai (CN)

(73) Assignee: SHANGHAI ANALOGY SEMICONDUCTOR TECHNOLOGY Ltd., Shanghai (CN)

( * ) Notice: Subject to any disclaimer, the term of this patent is extended or adjusted under 35 U.S.C. 154(b) by 0 days.

(21) Appl. No.: 17/633,555

(22) PCT Filed: Apr. 30, 2020

(86) PCT No.: PCT/CN2020/088511
§ 371 (c)(1),
(2) Date: Feb. 7, 2022

(87) PCT Pub. No.: WO2021/212543
PCT Pub. Date: Oct. 28, 2021

(65) Prior Publication Data
US 2023/0036578 A1    Feb. 2, 2023

(30) Foreign Application Priority Data
Apr. 21, 2020  (CN) .......................... 202010318200.7

(51) Int. Cl.
*H03F 3/45* (2006.01)
(52) U.S. Cl.
CPC .................... *H03F 3/45995* (2013.01); *H03F 2203/45042* (2013.01); *H03F 2203/45538* (2013.01); *H03F 2203/45594* (2013.01)

(58) Field of Classification Search
CPC .................................................. H03F 3/45995
See application file for complete search history.

(56) References Cited

U.S. PATENT DOCUMENTS

| 10,641,799 B2 * | 5/2020 | Schrom ................. H02M 3/157 |
| 2008/0297253 A1 * | 12/2008 | Li ............................ H03F 1/34 330/258 |

(Continued)

FOREIGN PATENT DOCUMENTS

| CN | 101257306 | 9/2008 |
| CN | 101364136 | 2/2009 |

(Continued)

OTHER PUBLICATIONS

CNIPA, Office Action dated Jun. 11, 2021, for CN Application No. 2020103182007, including English translation, 6 pages.

(Continued)

*Primary Examiner* — Patricia T Nguyen
(74) *Attorney, Agent, or Firm* — Fish & Richardson P.C.

(57) ABSTRACT

The present invention provides a common-mode rejection ratio and gain trimming circuit of differential amplifier, comprising: a first trimming unit and a second trimming unit coupled between an in-phase input voltage and a reference voltage, wherein the first trimming unit and the second trimming unit are coupled to a positive input terminal of the differential amplifier by means of tap switches; a third trimming unit and a fourth trimming unit coupled between tan inverting input voltage and an output terminal of the differential amplifier, wherein the third trimming unit and the fourth trimming unit are coupled to a negative input terminal of the differential amplifier by means of tap switches; wherein, the first trimming unit, the second trimming unit, the third trimming unit, and the fourth trimming unit comprise: a first trimming resistor string and a second trimming resistor string coupled in series; the first trimming (Continued)

resistor string is coupled in parallel with a first trimming auxiliary resistor string, and the second trimming resistor string is coupled in parallel with a second trimming auxiliary resistor string; wherein, the second trimming resistor string of the first trimming unit is coupled to the second trimming resistor string of the second trimming unit, and the second trimming resistor string of the third trimming unit is coupled to the second trimming resistor string of the fourth trimming unit.

10 Claims, 4 Drawing Sheets

(56) References Cited

U.S. PATENT DOCUMENTS

| | | | |
|---|---|---|---|
| 2013/0147548 | A1 | 6/2013 | Ikeda |
| 2015/0280662 | A1 | 10/2015 | Nimran et al. |
| 2017/0149397 | A1* | 5/2017 | Roy .................. H03G 1/0029 |
| 2018/0123535 | A1 | 5/2018 | Handa et al. |
| 2019/0149107 | A1* | 5/2019 | He ........................ H03F 3/187 |
| | | | 330/251 |
| 2020/0083852 | A1* | 3/2020 | Guidry ................ H03F 3/45197 |

FOREIGN PATENT DOCUMENTS

| | | |
|---|---|---|
| CN | 101847973 | 9/2010 |
| CN | 102624359 | 8/2012 |
| CN | 202634363 | 12/2012 |
| CN | 203039669 | 7/2013 |
| CN | 103248330 | 8/2013 |
| CN | 206023713 U | 3/2017 |
| CN | 107276151 | 10/2017 |
| CN | 108121390 | 6/2018 |
| CN | 108534805 | 9/2018 |
| CN | 110380692 | 10/2019 |
| JP | H06-290374 | 10/1994 |
| JP | H08335833 A | 12/1996 |
| JP | H11-317019 | 11/1999 |
| JP | 2000-314645 | 11/2000 |
| JP | 2005-518745 | 6/2005 |
| WO | WO 2021/212543 | 10/2021 |

OTHER PUBLICATIONS

International Preliminary Report on Patentability in International Appln. No. PCT/CN2020/088511, dated Nov. 3, 2022, 5 pages.
International Search Report and Written Opinion in International Appln. No. PCT/CN2020/088511, dated Jan. 20, 2021, 11 pages (with English translation).
Pang et al., "Design of a Broadband High-Gain Amplifier Used in Gathering and Protection Circuit," Semiconductor Technology, 2007, 32(6):532-534, 543 [English Summary Only].
Paul et al., "Analysis of Dissipated Power in Envelope Amplifier Output Filters," Proceedings of the 2018 48th European Microwave Conference (EuMC), Madrid, Spain, Sep. 25-27, 2018, 515-518.
Wan et al., "Trimmable High-Order Curvature Compensation Reference Voltage Source," Microelectronics, 2014, 6:759-762, 766 [English Abstract Only].

* cited by examiner

DIFFERENTIAL AMPLIFIER COMMON-MODE REJECTION RATIO AND GAIN TRIMMING CIRCUIT

TECHNICAL FIELD

The present invention generally relates to the field of electronic technology, and particularly relates to a common-mode rejection ratio and gain trimming circuit of differential amplifier.

BACKGROUND

With the rapid development of electronic technology, operational amplifier circuits have been widely used. There are many types of integrated operational amplifiers. As high-performance amplifier, instrumentation amplifier is popular in data acquisition, sensor signal amplification, high-speed signal conditioning, medical instruments, and high-grade audio equipment. The instrumentation amplifier integrates key components inside the amplifier, with a specific structure to achieve high common-mode rejection ratio, high input impedance, low noise, low linearity error, low offset drift, and has the characteristics of flexible gain setting and convenient use.

An output terminal OUT of the differential amplifier is coupled to an inverting input terminal of the differential amplifier by means of voltage-dividing resistor string R1, R2, and a shift level Vshift is coupled to an in-phase input terminal of the differential amplifier by means of voltage-dividing resistor string R4, R3 which may use to adjust Direct current level of the output voltage. The resistance value of the resistor string is usually selected: R3 is equal to R2, R4 is equal to R1. In this way, the resistance ratio of the voltage-dividing resistor string determines the size of the differential voltage gain Gain and common-mode rejection ratio CMRR, and the degree of accuracy of the resistance ratio of the voltage-dividing resistor string determines the gain error and common-mode rejection ratio CMRR. Wherein, the voltage gain and common-mode rejection ratio in FIG. 1 are:

$$\text{Gain} = \frac{1}{2} \cdot \frac{R1}{R2} + \frac{1}{2} \cdot \left(1 + \frac{R1}{R2}\right) \cdot \left(\frac{1}{1 + \frac{R3}{R4}}\right)$$

$$CMRR = \frac{1 + 2 \cdot \frac{R1}{R2} + \frac{R1}{R2} \cdot \frac{R3}{R4}}{2 \cdot \left(1 - \frac{R1}{R2} \cdot \frac{R3}{R4}\right)}$$

FIG. 2 shows an existing trimming circuit of the differential amplifier. The trimming resistor strings R3a and R3b need to be trimmed to achieve the gain trimming of the differential voltage amplifier. The resistor strings R3a and R3b are coupled in series by several identical unit resistors. the resistor strings R3a, R3b are tapped by trimming switches controlled by trimming signals and are coupled to two input terminals of the differential amplifier to fine-trimming the gain, and the relative change of the two tap positions can achieve common-mode rejection ratio trimming. For example, to achieve 8-bit trimming, resistor strings R3a and R3b must be coupled in series with 64 resistors with R/64 resistance value. The corresponding resistance trimming accuracy is R/64, and the resistance trimming accuracy determines the gain of the differential amplifier and the trimming accuracy of common-mode rejection ratio. If the resistor strings R3a, R3b are tapped to 64-k and k unit resistors, the gain of the differential amplifier is:

$$\text{Gain} = \frac{R2 + k*R}{R1 + (64-k)*R}$$

To achieve higher trimming accuracy, a unit resistor with a smaller resistance value is required, and for certain process conditions, a unit resistor with a too small resistance value is often difficult to achieve. Because instrumentation amplifiers have very high requirements for gain accuracy and common-mode rejection ratio, the unit resistor strings of trimming resistor strings R3a and R3b are very small, usually only a few ohms, and it is difficult for general digital trimming methods to achieve such a small value. The accuracy requirements of the laser trimming method are usually used. This not only greatly increases the cost of the circuit, but also increases the cost of testing and trimming time.

SUMMARY OF THE INVENTION

The purpose of the present invention is to provide a common-mode rejection ratio and gain trimming circuit of differential amplifier to improve trimming accuracy.

In order to solve the above problems, this application discloses a common-mode rejection ratio and gain trimming circuit differential amplifier, comprising:

a first trimming unit and a second trimming unit coupled between an in-phase input voltage and a reference voltage, wherein the first trimming unit and the second trimming unit are coupled to a positive input terminal of the differential amplifier by means of tap switches;

a third trimming unit and a fourth trimming unit coupled between an inverting input voltage and an output terminal of the differential amplifier, wherein the third trimming unit and the fourth trimming unit are coupled to a negative input terminal of the differential amplifier by means of tap switches;

wherein, the first trimming unit, the second trimming unit, the third trimming unit, and the fourth trimming unit comprise: a first trimming resistor string and a second trimming resistor string coupled in series; wherein the first trimming resistor string is coupled in parallel with a first trimming auxiliary resistor string, and the second trimming resistor string is coupled in parallel with a second trimming auxiliary resistor string;

wherein, the second trimming resistor string of the first trimming unit is coupled to the second trimming resistor string of the second trimming unit, and the second trimming resistor string of the third trimming unit is coupled to the second trimming resistor string of the fourth trimming unit.

In a preferred embodiment, the first trimming resistor string comprise $2^n-1$ unit resistors coupled in series, and the first trimming auxiliary resistor string comprises one unit resistor, wherein n is an integer greater than one.

In a preferred embodiment, each of the $2^n-1$ unit resistors of the first trimming resistor string in the first trimming unit is coupled to the negative input terminal of the differential amplifier through a switch, and each of the $2^n-1$ unit resistors of the first trimming resistor string in the third trimming unit is coupled to the positive input terminal of the differential amplifier through a switch.

In a preferred embodiment, the second trimming resistor string comprises $2^m$ unit resistors coupled in series, and the second trimming auxiliary resistor string comprises $2^n$ unit resistors coupled in parallel, wherein n is an integer greater than one, and m is an integer greater than one.

In a preferred embodiment, each of the $2^m$ unit resistors of the second trimming resistor string in the second trimming unit is coupled to the negative input terminal of the differential amplifier through a switch, and each of the $2^m$ unit resistors of the second trimming resistor string in the fourth trimming unit is coupled to the positive input terminal of the differential amplifier through a switch.

In a preferred embodiment, a value range of then is 4-16, and a value range of the m is 4-16.

In a preferred embodiment, the trimming circuit further comprises a first input resistor, wherein the first input resistor is coupled between the inverting input voltage and the first trimming resistor string of the first trimming unit.

In a preferred embodiment, the trimming circuit further comprises a second input resistor, wherein the second input resistor is coupled between the in-phase input voltage and the first trimming resistor string of the third trimming unit.

In a preferred embodiment, the trimming circuit further comprises a first output resistor, wherein the first output resistor is coupled between the first trimming resistor string of the second trimming unit and the reference voltage.

In a preferred embodiment, the trimming circuit further comprises a second output resistor, wherein the second output resistor is coupled between the first trimming resistor string of the fourth trimming unit and the output terminal of the differential amplifier.

Compared with the prior art, this application has at least the following beneficial effects:

1) The implementation of this specification adopts all-digital trimming to complete, without laser trimming, thereby reducing circuit cost and testing and trimming cost.

2) Compared with the traditional digital trimming resistor DAC structure, the unit trimming resistance value required in this implementation can be larger when the trimming accuracy and the feedback resistance are the same. And with the same trimming accuracy and unit trimming resistance, the feedback resistance required in this implementation is smaller, so the circuit cost is lower.

A large number of technical features are described in the specification of the present application, and are distributed in various technical solutions. If a combination (ie, a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

BRIEF DESCRIPTION OF THE FIGURES

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Embodiment 1

Figure 3:
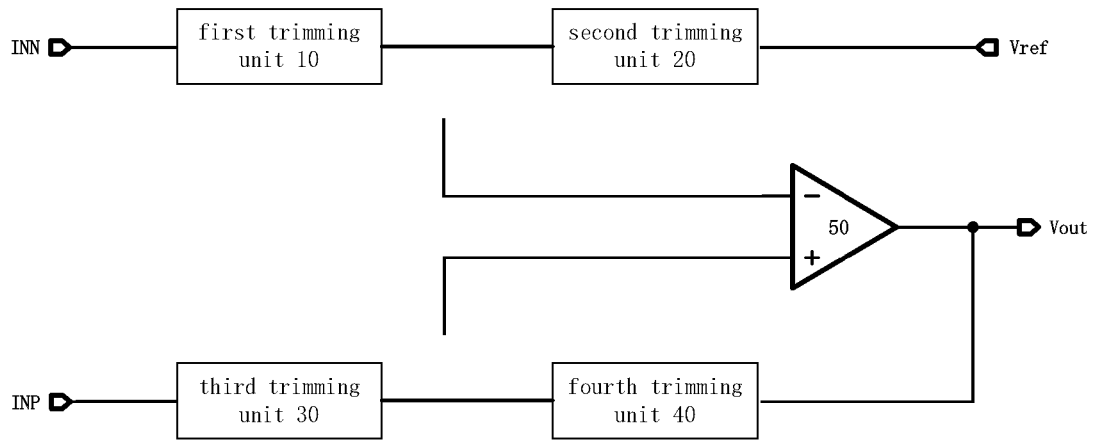
FIG. 3 shows a block diagram of a gain trimming circuit of differential amplifier in an embodiment of the present invention.

This embodiment discloses a common-mode rejection ratio and gain trimming circuit of differential amplifier, and FIG. 3 shows a schematic diagram of the common-mode rejection ratio and gain trimming circuit of differential amplifier in this embodiment. The trimming circuit comprises: a first trimming unit 10 and a second trimming unit 20 coupled between an in-phase input voltage INP and the reference voltage Vref, wherein the first trimming unit 10 and the second trimming unit 20 are coupled to a positive input terminal of the differential amplifier 50 through tap switches; and the third trimming unit 30 and the fourth trimming unit 40 coupled between an inverting input voltage INN and the output terminal Vout of the differential amplifier 50, wherein the third trimming unit 30 and the fourth trimming unit 40 are coupled to a negative input terminal of the differential amplifier 50 through tap switches. By changing the tap positions of the first trimming unit 10, the second trimming unit 20, the third trimming unit 30, and the fourth trimming unit 40, the gain can be fine-tuned. The relative change of the tap positions of the positive and negative input terminals of the differential amplifier 50 can realize the adjustment of the common-mode rejection ratio.

The structures of the first trimming unit 10, the second trimming unit 20, the third trimming unit 30, and the fourth trimming unit 40 are the same. The first trimming unit 10, the second trimming unit 20, the third trimming unit 30, and the fourth trimming unit 40 are respectively comprise: a first trimming resistor string and a second trimming resistor string coupled in series. The first trimming resistor string is coupled in parallel with a first trimming auxiliary resistor string, and the second trimming resistor string is coupled in parallel with a second trimming auxiliary resistor string. Wherein, the first trimming resistor string of the first trimming unit 10 and the second trimming resistor string of the second trimming unit 20 are symmetrically arranged, that is, the first trimming resistor string of the first trimming unit 10, the second trimming resistor string of the first trimming unit 10, the second trimming resistor string of the second trimming unit 20, and the first trimming resistor string of the second trimming unit 20 are sequentially coupled. The first trimming resistor string of the third trimming unit 30 and the second trimming resistor string of the fourth trimming unit 40 are symmetrically arranged, that is, the first trimming resistor string and the second trimming resistor string of the third trimming unit 30, the second trimming resistor string and the first trimming resistor string of the fourth trimming unit 40 are sequentially coupled. In this embodiment, the first trimming unit 10 and the third trimming unit 30 are used to implement coarse adjustment, and the second trimming unit 20 and the fourth trimming unit 40 are used to implement meticulous adjustment.

Figure 4:
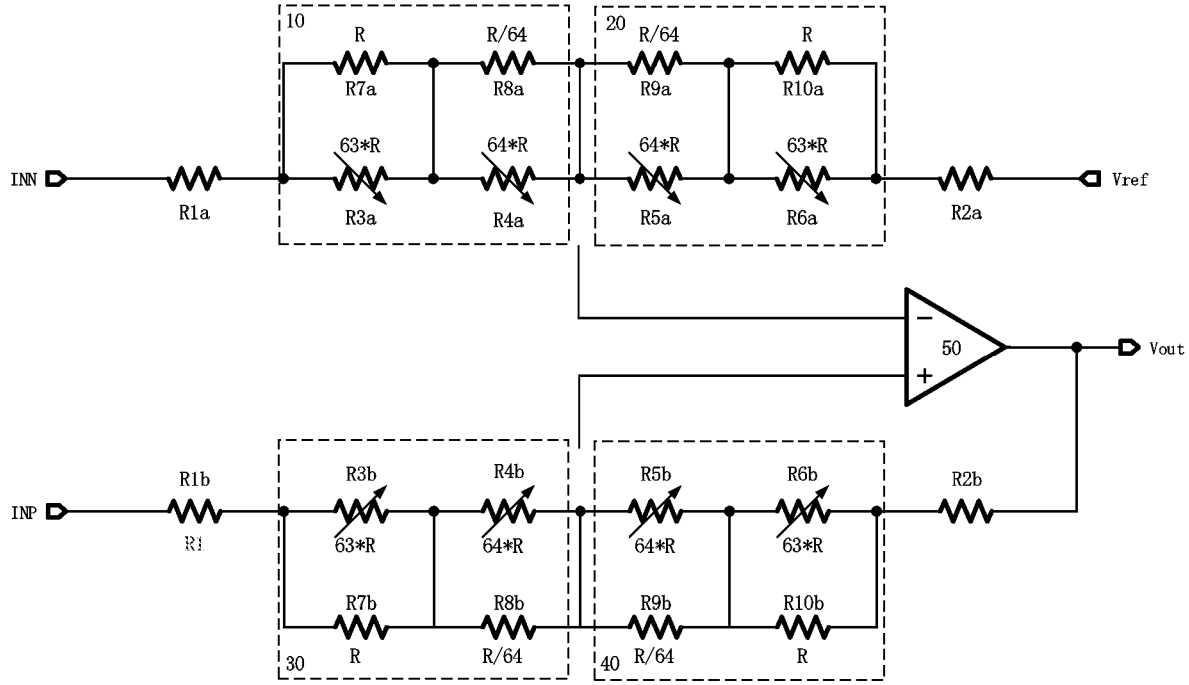
FIG. 4 shows a schematic diagram of a gain trimming circuit of differential amplifier in an embodiment of the present invention.

FIG. 4 shows a more detailed schematic diagram of the common-mode rejection ratio and gain trimming circuit of the differential amplifier in this embodiment. The first trimming unit 10 comprises a first trimming resistor string R3$a$ and a second trimming resistor string R4$a$ coupled in series. The first trimming resistor string R3$a$ is coupled in parallel with a first trimming auxiliary resistor string R7$a$, and the second trimming resistor string R4$a$ is coupled in parallel with a second trimming auxiliary resistor string R8$a$. The second trimming unit 20 comprises a first trimming resistor string R6$a$ and the second trimming resistor string R5$a$. The first trimming resistor string R6$a$ is coupled in parallel with a first trimming auxiliary resistor string R10$a$, and the second trimming resistor string R5$a$ is coupled in parallel with a second trimming auxiliary resistor string R9$a$. The third trimming unit 30 comprises a first trimming resistor string R3$b$ and the second trimming resistor string R4$b$. The first trimming resistor string R3$b$ is coupled in parallel with a first trimming auxiliary resistor string R7$b$, and the second trimming resistor string R4$b$ is coupled in parallel with a second trimming auxiliary resistor string R8$b$. The fourth trimming unit 40 comprises a first trimming resistor string R6$b$ and the second trimming resistor string R5$b$, wherein the first trimming resistor string R6$b$ is coupled in parallel with a first trimming auxiliary resistor string R10$b$, and the second trimming resistor string R5$b$ is coupled in parallel with a second trimming auxiliary resistor string R9$b$.

Wherein the first trimming resistor string R3$a$, the second trimming resistor string R4$a$, the second trimming resistor string R5$a$, and the first trimming resistor string R6$a$ are sequentially coupled. The first trimming resistor string R3$b$, the second trimming resistor string R4$b$, the second trimming resistor string R5$b$, and the first trimming resistor string R6$b$ are sequentially coupled.

In an embodiment, the first trimming resistor strings R3$a$, R3$b$, R6$a$, R6$b$ comprise 63 unit resistors coupled in series, and the first trimming auxiliary resistor strings R7$a$, R7$b$, R10$a$, R10$b$ comprise one unit resistor. In this embodiment, the unit resistor is represented by R.

In an embodiment, the second trimming resistor strings R4$a$, R4$b$, R5$a$, R5$b$ comprise 64 unit resistors coupled in series, and the second trimming auxiliary resistor strings R8$a$, R8$b$, R9$a$, R9$b$ comprise 64 unit resistors coupled in parallel.

Figure 6:
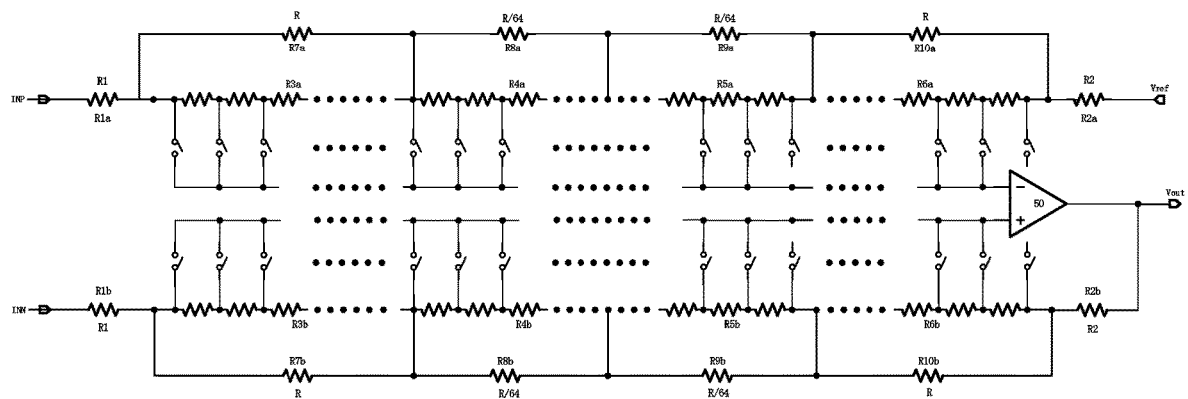
FIG. 6 shows a schematic diagram of tap connection of a trimming circuit in an embodiment of the present invention.

FIG. 6 shows a schematic diagram of the tap connection of the trimming circuit in this embodiment. In an embodiment, each of the 63 unit resistors of the first trimming resistor strings R3$a$, R6$a$ is coupled to the negative input terminal of the differential amplifier 50 through a switch, and each of the 63 unit resistors of the first trimming resistor strings R3$b$, R6$b$ is coupled to the positive input terminal of the differential amplifier 50 through a switch. In an embodiment, each of the 64 unit resistors of the second trimming resistor strings R4$a$, R5$a$ is coupled to the negative input terminal of the differential amplifier 50 through a switch, and each of the 64 unit resistors of the second trimming resistor strings R4$b$, R5$b$ is coupled to the positive input terminal of the differential amplifier 50 through a switch. In this embodiment, the first trimming resistor strings R3$a$, R3$b$, R6$a$, R6$b$ comprise 63 switches, and the second trimming resistor strings R4$a$, R4$b$, R5$a$, R5$b$ comprise 64 switches, and the trimming circuit comprise a total of 254 switches.

Figure 5:
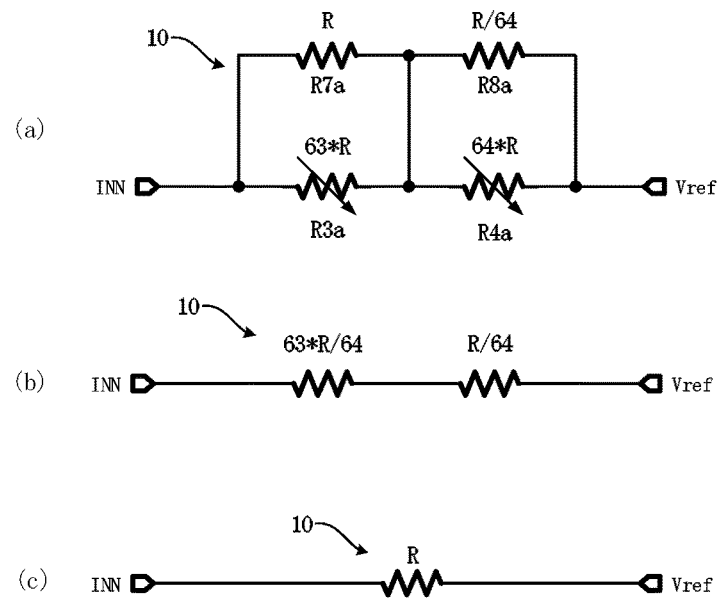
FIG. 5 shows an equivalent circuit diagram of a trimming unit in an embodiment of the present invention.

FIG. 5 shows an equivalent circuit diagram of the first trimming unit 10. The equivalent resistance value of the first trimming resistor string R3$a$ and the first trimming auxiliary resistor string R7$a$ coupled in parallel is approximately $$\frac{63}{64}R,$$

and me equivalent resistance value of the second trimming resistor string R4$a$ and the second trimming resistor string R8$a$ coupled in parallel is approximately $$\frac{R}{64}.$$

Therefore, the equivalent resistance of the first trimming unit 10 is a unit resistance R. Similarly, the equivalent resistance values of the second trimming unit 20, the third trimming unit 30, and the fourth trimming unit 40 are also a unit resistance R, which will not be repeated here.

Continuing to refer to FIG. 4, in an embodiment, the trimming circuit further comprises a first input resistor R1$a$, wherein the first input resistor R1$a$ is coupled between the inverting input voltage INN and the first trimming unit 10. In an embodiment, the trimming circuit further comprises a second input resistor R1$b$, wherein the second input resistor R1$b$ is coupled between the in-phase input voltage INP and the third trimming unit 30. In an embodiment, the resistance values of the first input resistor R1$a$ and the second input resistor R1$b$ are R1.

Continuing to refer to FIG. 4, in an embodiment, the trimming circuit further comprises a first output resistor R2$a$, wherein the first output resistor R2$a$ is coupled between the second trimming unit 20 and the reference voltage Vref. In an embodiment, the trimming circuit further comprises a second output resistor R2$b$, wherein the second output resistor R2$b$ is coupled between the fourth trimming unit 40 and the output terminal Vout of the differential amplifier 50. In an embodiment, the resistance values of the first output resistor R2a and the second output resistor R2b are R2. For example, in an embodiment, the unit resistance R is equal to 1 kΩ, R1 is equal to 49R, and R2 is equal to 49R.

Assuming that the second trimming resistor string R5a of the second trimming unit 20 or the R5b of the fourth trimming unit 40 is tapped into k*R and (64−k)*R, and the gain of the amplifier is:

$$\text{Gain} = \frac{R2 + \frac{R}{64} + \frac{k*R}{4096}}{R1 + R + \frac{(64-k)*R}{4096}}$$

Figure 1:
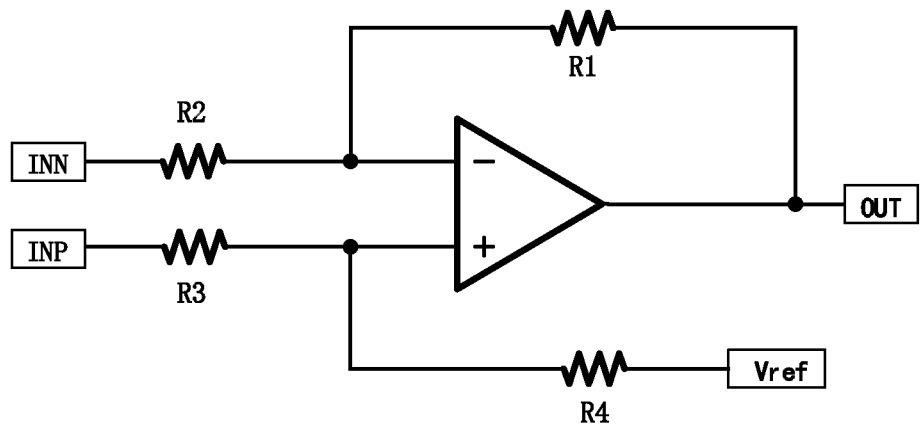
FIG. 1 shows a schematic diagram of a differential voltage amplifier circuit in the prior art.
Figure 2:
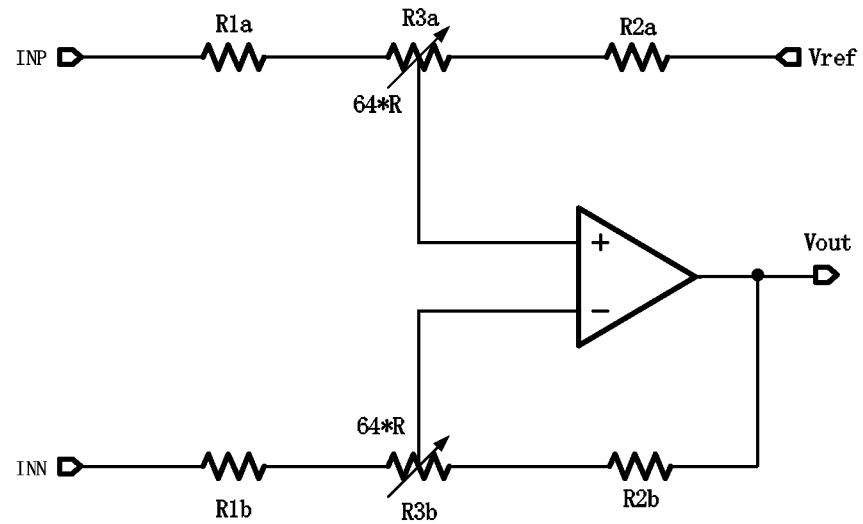
FIG. 2 shows a schematic diagram of a gain trimming circuit of differential amplifier in the prior art.

Compared with the trimming circuit of the prior art (shown in FIG. 2), the resistance trimming accuracy of the trimming circuit in this embodiment is R/4096, and the smallest resistance used in this embodiment and the trimming circuit in FIG. 2 is the same as R/64. Therefore, for the determined minimum resistance, the trimming accuracy of the structure in this embodiment is much higher than that in FIG. 2.

In this embodiment, if tapped at the first trimming resistor strings R3a, R3b, R6a, R6b, the corresponding trimming accuracy is R/64 to achieve coarse trimming, and if tapped at the second trimming resistor strings R4a, R4b, R5a, R5b, the corresponding trimming accuracy is R/4096 to achieve meticulous trimming. For the trimming circuit in this embodiment, the trimming accuracy can be selected as required.

In the embodiment, the number of trimming bits of the first trimming unit 10 and the third trimming unit 30 are 6 bits respectively, and are used to implement positive trimming. The number of trimming bits of the third trimming unit 30 and the fourth trimming units 40 are 6 bits respectively, and are used to realize negative trimming. Therefore, the number of trimming bits in this application is 7 bits.

In this embodiment, using full digital trimming, and the laser trimming is not required, thereby reducing circuit cost and testing and trimming cost.

Embodiment 2

The trimming circuit in this embodiment is basically the same as the trimming circuit in the embodiment 1. The difference is that in this embodiment, the second trimming resistor strings R4a, R4b, R5a, R5b respectively comprise $2^m$ unit resistors coupled in series, therefore, the number of trimming bits in this embodiment is m+1 bits.

Embodiment 3

The trimming circuit in this embodiment is basically the same as the trimming circuit in the embodiment 1. The difference is that in this embodiment, the second trimming auxiliary trimming resistor strings R8a, R8b, R9a, R9b comprise $2^n$ unit resistors coupled in parallel. The first trimming resistor strings R3a, R3b, R5a, R5b comprise $2^{11}-1$ unit resistors coupled in parallel. In this embodiment, the minimum resistance is $$\frac{R}{2^n},$$

and different minimum resistance values can be used as required.

Embodiment 4

Figure 7:
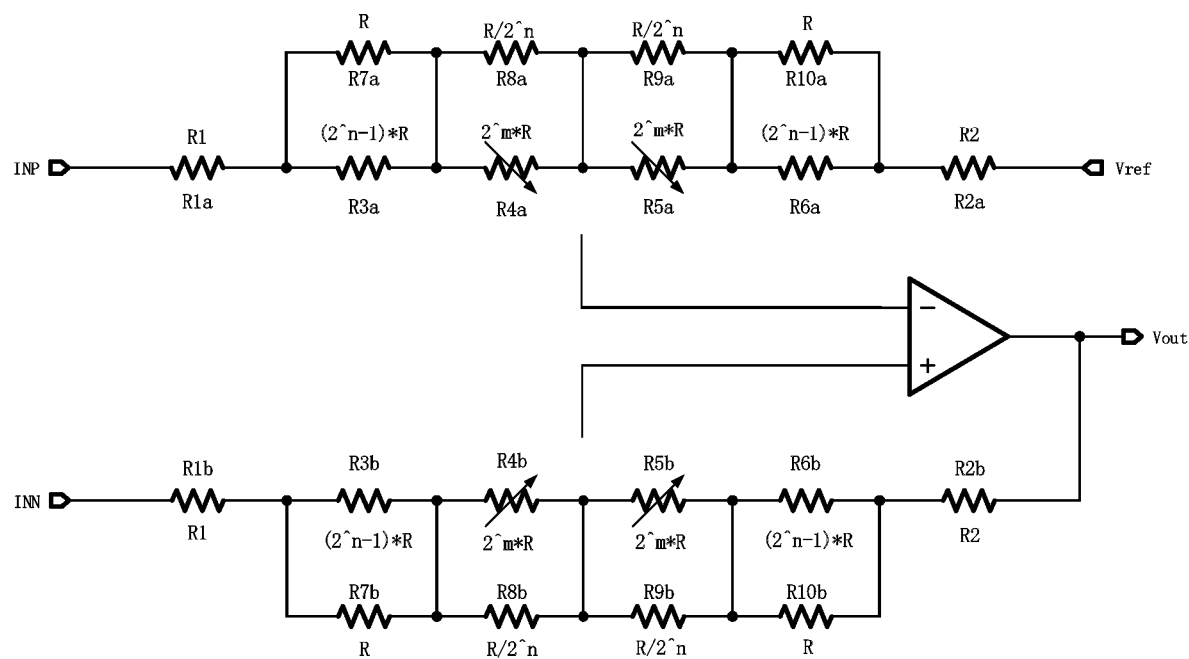
FIG. 7 shows a schematic diagram of a gain trimming circuit of differential amplifier in another embodiment of the present invention.

FIG. 7 shows a schematic diagram of the gain trimming circuit of the differential amplifier in this embodiment. The first trimming resistor strings R3a, R3b, R6a, R6b comprise $2^n-1$ unit resistors coupled in series, and the first trimming auxiliary resistor strings R7a, R7b, R10a, R10b comprise one unit resistor, wherein n is an integer greater than one. In this embodiment, each of the $2^n-1$ unit resistors of the first trimming resistor strings R3a, R3b, R6a, R6b is coupled to the positive input terminal or the negative input terminal of the differential amplifier through a switch.

In this embodiment, the second trimming resistor strings R4a, R4b, R5a, R5b comprise $2^m$ unit resistors coupled in series, and the second trimming auxiliary resistor strings R8a, R8b, R9a, R9b comprise $2^n$ unit resistors coupled in parallel, wherein n is an integer greater than one, and m is an integer greater than one. In this embodiment, each of the $2^m$ unit resistors of the second trimming resistor strings R4a, R4b, R5a, R5b is coupled to the positive input terminal or the negative input terminal of the differential amplifier through a switch.

In an embodiment, the n is 4-16, and the m is 4-16.

Assuming that the resistance values of the second trimming resistor strings R5a, R5b are divided into k*R and $(2^m-k)$*R by the tap, and the gain of the differential amplifier is:

$$\text{Gain} = \frac{R2 + \frac{(2^n-1)*R}{2^n} + \frac{k*R}{2^{m+n}+1}}{R1 + R + \frac{(2^m-k)*R}{2^{m+n}+1}}$$

The trimming accuracy in this embodiment is $$\frac{R}{2^{m+n}+1}.$$

The trimming accuracy of the traditional trimming method shown in FIG. 2 is only related to the minimum resistance value, so the adjustment accuracy of the embodiment is related to the minimum resistance value and the bits of trimming resistors. When the minimum resistance value is limited, the trimming accuracy can be improved by increasing the bits of trimming resistors.

Compared with the traditional digital trimming resistor DAC structure, the unit trimming resistance value required in this implementation can be larger when the trimming accuracy and the feedback resistance are the same. And with the same trimming accuracy and unit trimming resistance, the feedback resistance required in this implementation is smaller, so the circuit cost is lower.

It should be noted that all or any of the embodiments described above can be combined with each other, unless otherwise stated or such embodiments may be mutually exclusive in terms of functionality and/or architecture.

It should be noted that in the application documents of the present patent, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In the application file of this patent, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

What is claimed is:

1. A common-mode rejection ratio and gain trimming circuit of differential amplifier, comprising:
   a first trimming unit and a second trimming unit coupled between an in-phase input voltage and a reference voltage, wherein the first trimming unit and the second trimming unit are coupled to a positive input terminal of the differential amplifier by means of tap switches;
   a third trimming unit and a fourth trimming unit coupled between an inverting input voltage and an output terminal of the differential amplifier, wherein the third trimming unit and the fourth trimming unit are coupled to a negative input terminal of the differential amplifier by means of tap switches;
   wherein, the first trimming unit, the second trimming unit, the third trimming unit, and the fourth trimming unit comprise: a first trimming resistor string and a second trimming resistor string coupled in series; wherein the first trimming resistor string is coupled in parallel with a first trimming auxiliary resistor string, and the second trimming resistor string is coupled in parallel with a second trimming auxiliary resistor string;
   wherein, the second trimming resistor string of the first trimming unit is coupled to the second trimming resistor string of the second trimming unit, and the second trimming resistor string of the third trimming unit is coupled to the second trimming resistor string of the fourth trimming unit.

2. The common-mode rejection ratio and gain trimming circuit of differential amplifier according to claim 1, wherein the first trimming resistor string comprise $2^n-1$ unit resistors coupled in series, and the first trimming auxiliary resistor string comprises one unit resistor, wherein n is an integer greater than one.

3. The common-mode rejection ratio and gain trimming circuit of differential amplifier according to claim 2, wherein each of the $2^n-1$ unit resistors of the first trimming resistor string in the first trimming unit is coupled to the negative input terminal of the differential amplifier through a switch, and each of the $2^n-1$ unit resistors of the first trimming resistor string in the third trimming unit is coupled to the positive input terminal of the differential amplifier through a switch.

4. The common-mode rejection ratio and gain trimming circuit of differential amplifier according to claim 1, wherein the second trimming resistor string comprises $2^m$ unit resistors coupled in series, and the second trimming auxiliary resistor string comprises $2^n$ unit resistors coupled in parallel, wherein n is an integer greater than one, and m is an integer greater than one.

5. The common-mode rejection ratio and gain trimming circuit of differential amplifier according to claim 4, wherein each of the $2^m$ unit resistors of the second trimming resistor string in the second trimming unit is coupled to the negative input terminal of the differential amplifier through a switch, and each of the $2^m$ unit resistors of the second trimming resistor string in the fourth trimming unit is coupled to the positive input terminal of the differential amplifier through a switch.

6. The common-mode rejection ratio and gain trimming circuit of differential amplifier according to claim 4, wherein a value range of the n is 4-16, and a value range of the m is 4-16.

7. The common-mode rejection ratio and gain trimming circuit of differential amplifier according to claim 1, wherein the trimming circuit further comprises a first input resistor, wherein the first input resistor is coupled between the inverting input voltage and the first trimming resistor string of the first trimming unit.

8. The common-mode rejection ratio and gain trimming circuit of differential amplifier according to claim 1, wherein the trimming circuit further comprises a second input resistor, wherein the second input resistor is coupled between the in-phase input voltage and the first trimming resistor string of the third trimming unit.

9. The common-mode rejection ratio and gain trimming circuit of differential amplifier according to claim 1, wherein the trimming circuit further comprises a first output resistor, wherein the first output resistor is coupled between the first trimming resistor string of the second trimming unit and the reference voltage.

10. The common-mode rejection ratio and gain trimming circuit of differential amplifier according to claim 1, wherein the trimming circuit further comprises a second output resistor, wherein the second output resistor is coupled between the first trimming resistor string of the fourth trimming unit and the output terminal of the differential amplifier.

* * * * *